US010557906B2

(12) United States Patent
Chen et al.

(10) Patent No.: US 10,557,906 B2
(45) Date of Patent: Feb. 11, 2020

(54) QUANTITATIVE MAGNETIC RESONANCE IMAGING RELAXOMETRY WITH SUPPRESSION OF BLOOD SIGNAL

(71) Applicant: The Chinese University of Hong Kong, Shatin, New Territories, Hong Kong (CN)

(72) Inventors: Weitian Chen, Shatin (CN); Yi-xiang Wang, Hong Kong (CN); Jiang Baiyan, Jakarta (ID)

(73) Assignee: The Chinese University of Hong Kong, Shatin, N.T., Hong Kong, SAR (CN)

(*) Notice: Subject to any disclaimer, the term of this patent is extended or adjusted under 35 U.S.C. 154(b) by 251 days.

(21) Appl. No.: 15/499,518

(22) Filed: Apr. 27, 2017

(65) Prior Publication Data

US 2017/0315198 A1    Nov. 2, 2017

Related U.S. Application Data

(60) Provisional application No. 62/329,455, filed on Apr. 29, 2016.

(51) Int. Cl.
*G01V 3/00* (2006.01)
*G01R 33/56* (2006.01)
*G01R 33/44* (2006.01)
*G01R 33/50* (2006.01)
*G01R 33/54* (2006.01)

(52) U.S. Cl.
CPC ....... *G01R 33/5607* (2013.01); *G01R 33/448* (2013.01); *G01R 33/50* (2013.01); *G01R 33/543* (2013.01)

(58) Field of Classification Search
USPC .......................................... 324/309
See application file for complete search history.

(56) References Cited

U.S. PATENT DOCUMENTS 7,425,828 B2 * 9/2008 Garwood ............... G01N 24/10
                                                        324/310
9,149,203 B2 * 10/2015 Kim ....................... A61B 5/055
(Continued)

OTHER PUBLICATIONS

Busse et al., "Fast spin Echo Sequence with Very Long Echo Trains: Design of Variable Refocusing Flip Angle Schedules and Generation of Clinical $T_2$ Contrast," *Magnetic Resonance in Medicine* 55:1030-1037 (2006).

(Continued)

*Primary Examiner* — Rodney E Fuller
(74) *Attorney, Agent, or Firm* — Kilpatrick Townsend & Stockton LLP

(57) ABSTRACT

Pulse sequences for an MRI apparatus can provide improved quantitative relaxometry in liver and other tissues. Relaxation parameters such as T1rho or T2 (or both at once) can be measured. The pulse sequence can include a magnetization preparation pulse sequence and an acquisition pulse sequence including a fast spin echo (FSE) pulse sequence. Flip angles and echo time for the FSE pulse sequence can be chosen to optimize image quality without affecting the quantification of a relaxation parameter. Additional pulse sequences, e.g., for enhanced blood suppression and/or fat suppression can be incorporated. The acquisition pulse sequence can have a duration that allows data for a single slice image to be acquired during a breath-hold.

53 Claims, 16 Drawing Sheets
(11 of 16 Drawing Sheet(s) Filed in Color)

(56) References Cited

U.S. PATENT DOCUMENTS

| | | | | |
|---|---|---|---|---|
| 2011/0275928 A1* | 11/2011 | Kim | ........................ | A61B 5/055 600/413 |
| 2012/0101367 A1* | 4/2012 | Kim | ........................ | A61B 5/055 600/413 |
| 2012/0262175 A1* | 10/2012 | Alsop | ................ | G01R 33/5607 324/314 |
| 2015/0042335 A1* | 2/2015 | Nehrke | .............. | G01R 33/5659 324/309 |
| 2017/0212195 A1* | 7/2017 | Rehwald | ............ | G01R 33/5602 |
| 2018/0031661 A1* | 2/2018 | Chen | ........................ | A61B 5/055 |
| 2019/0056470 A1* | 2/2019 | Wang | ................... | A61B 5/0037 |

OTHER PUBLICATIONS

Chen et al., "Quantitative $T_{1\rho}$ Imaging Using Phase Cycling for $B_0$ and $B_1$ Field Inhomogeneity Compensation," *Magnetic Resonance Imaging*, 29 (2011) 608-619.

Li et al., "DANTE-Prepared Pulse Trains: A Novel Approach to Motion-Sensitized and Motion-Suppressed Quantitative Magnetic Resonance Imaging," *Magnetic Resonance in Medicine*, 68:1423-1438 (2012).

Park et al., "Gradient Reversal Technique and Its Applications to Chemical-Shift-Related NMR Imaging," *Magnetic Resonance in Medicine* 4, 526-536 (1987).

Russell et al., "Composite Metric $R_2$-$R_{1\rho}$ ($1/T_2$-$1/T_{1\rho}$) as a Potential MR Imaging Biomarker Associated with Changes in Pain After ACL Reconstruction: A Six-Month Follow-Up," *Journal of Orthopaedic Research*, Aug. 25, 2016.

Wang et al., "Improved Suppression of Plaque-Mimicking Artifacts in Black-Blood Carotid Atherosclerosis Imaging Using a Multislice Motion Sensitized driven-Equilibrium (MSDE) Turbo Spin-Echo (TSE) Sequence," *Magnetic Resonance in Medicine*, 58:973-981 (2007).

Witschey et al., "Artifacts in T1p-weighted imaging: Compensation for $B_1$ and $B_0$ field imperfections," *Journal of Magnetic Resonance*, 186 (2007) 75-85.

\* cited by examiner

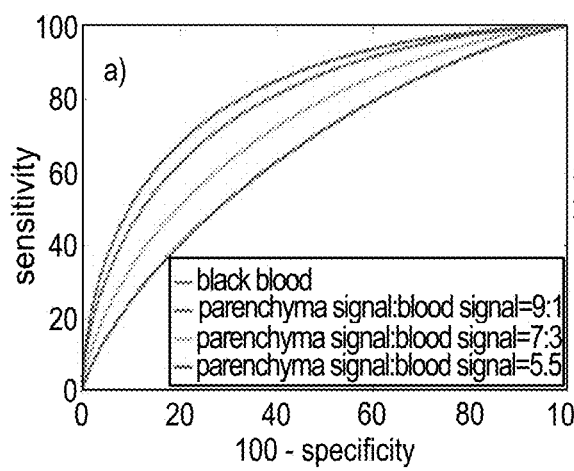 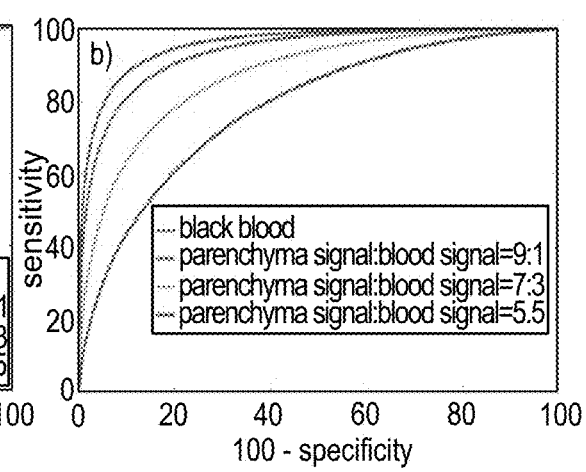
*FIG. 13A*    *FIG. 13B*

QUANTITATIVE MAGNETIC RESONANCE IMAGING RELAXOMETRY WITH SUPPRESSION OF BLOOD SIGNAL

CROSS-REFERENCE TO RELATED APPLICATIONS

This application claims the benefit of U.S. Provisional Application No. 62/329,455, filed Apr. 29, 2016, the entire disclosure of which is incorporated herein by reference.

BACKGROUND

The present invention relates generally to magnetic resonance imaging (MRI) and in particular to imaging techniques using pulse sequences that enable quantitative magnetic resonance imaging relaxometry, including T1rho and T2, for a tissue (such as liver tissue) with suppression of blood signal.

Liver fibrosis is a key feature in most chronic liver diseases. It can lead to liver cirrhosis, terminal liver failure, and hepatocellular carcinoma. Currently, the preferred technique for diagnosis of liver fibrosis is a biopsy. Biopsies, however, are invasive and carry risks of various complications. Noninvasive alternatives would be desired, but so far, they are not sufficiently robust or reliable.

Magnetic resonance imaging (MRI) provides the promise of a noninvasive diagnostic technique that can allow assessments of the composition and state of various tissues. In an MRI procedure, a patient is placed in a strong longitudinal magnetic field that aligns nuclear spins of atoms in the patient's body, producing a net magnetization vector. Radio frequency (RF) pulses with magnetic field components transverse to the longitudinal field and frequencies tuned to the Larmor frequency of an isotope of interest (often $^1$H) are applied. These pulses can flip spins into a higher energy state, resulting in a transverse component to the magnetization vector. As these spins return to the ground state, responsive signals from the patient's body can be detected. Based on the response to the RF pulses, characteristics of the magnetization can be measured. Commonly used measurements include the spin-lattice relaxation time (T1), measurement of which is typically based on recovery of the longitudinal component of the magnetization vector, and the spin-spin relaxation time (T2), measurement of which is typically based on decay of the transverse component of the magnetization vector. Since different anatomical structures have different material compositions, quantification of T1 and/or T2 can provide information about the material composition of a structure being imaged, and particular pulse sequences can be optimized to quantify T1 or T2. Mill has been used to achieve high-resolution images of a variety of anatomical structures, including organs such as the liver. However, existing Mill pulse sequences have not proven reliable for detecting liver fibrosis, particularly in early stages.

SUMMARY

A quantifiable spin-relaxation parameter that is the subject of recent interest is the spin-lattice relaxation time in the rotating frame (T1rho, or T1ρ. For T1rho measurement, a long-duration low-power RF pulse, referred to as a spin-lock pulse, is applied to lock the magnetization around an effective magnetic field. T1rho characterizes the relaxation of the magnetization after the spin-lock pulse. T2 relaxometry is also commonly used in Mill, and in clinical use, T2 and T1rho may provide complementary diagnostic information.

Both T2 and T1rho may be valuable biomarkers for assessment of tissue macromolecular environment. For instance, recent studies on rats have observed that mid-to-late-stage fibrotic liver tissue has proportionately elevated T1rho values compared to normal liver tissue. However, performing T1rho and T2 relaxometry in the livers of human subjects is challenging, in part because liver tissue is rich in blood vessels, which can contribute to elevated relaxation parameter values. Further, even minor spatial misregistration between images acquired with different levels of magnetization prep can lead to artificially elevated measurements. Thus, it would be desirable to develop methods for MM relaxometry, including T1rho and T2, of liver tissue that suppress the blood signal (sometimes referred to as "black blood effect," as suppression of the blood signal results in blood vessels appearing black in images) and that allow for fast acquisition of images in order to reduce spatial misregistration and/or other motion-related artifacts.

Certain embodiments of the present invention relate to pulse sequences for an MRI apparatus that can provide improved MRI T1rho and/or T2 relaxometry in liver and other tissues. In some embodiments, the pulse sequence can include a magnetization preparation ("magnetization prep") pulse sequence and an acquisition pulse sequence including a fast spin echo (FSE) or turbo spin echo (TSE) imaging pulse sequence. Flip angles and echo time for the FSE pulse sequence can be chosen to optimize image quality without affecting the quantification. Additional pulse sequences, e.g., for enhanced blood and/or fat suppression, can be incorporated. The acquisition pulse sequence allows data acquisition to be completed during a breath-hold. In some embodiments, T1rho and T2 acquisition can be performed during the same breath-hold.

Pulse sequences described herein can be used to obtain breath-hold single slice MM T1rho and/or T2 relaxometry of a subject of interest, with suppression of blood signal. Suppression of blood signal can be achieved as a consequence of the pulse sequence and/or by incorporating additional pulse sequences. Data acquisition can be fast enough that a single slice can be completed in a breath-hold (a scan time short enough that most patients will be able to hold their breath for the duration of the scan), which can reduce spatial misregistration and/or other motion-related artifacts. In some embodiments, the subject of interest may be the liver of a patient; however, it is to be understood that techniques described herein can be applied to other organs and tissues.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIG. 5A shows a graph representing four different schemes of refocusing flip angle trains used in the simulations; and FIG. 5B shows the calculated T1rho for each tissue type, for multiple different sets of pulse sequence parameters.

FIGS. 13A and 13B show receiver operating characteristic curves generated using Monte Carlo simulations with different levels of blood suppression according to an embodiment of the present invention. In FIG. 13A, the difference in T1rho between diseased and normal liver parenchyma is assumed to be 5 ms; in FIG. 13A, the difference is assumed to be 10 ms.

DETAILED DESCRIPTION

Certain embodiments of the present invention relate to pulse sequences for an MRI apparatus that can provide improved relaxometry in liver and other tissues. In some embodiments, the pulse sequence can include a magnetization preparation ("magnetization prep") pulse sequence and an acquisition pulse sequence including a fast spin echo (FSE) or turbo spin echo (TSE) imaging pulse sequence. Flip angles and echo time for the FSE pulse sequence can be chosen to optimize image quality without affecting the quantification. Additional pulse sequences, e.g., for enhanced blood and/or fat suppression, can be incorporated. The acquisition pulse sequence allows data acquisition to be completed during a breath-hold.

Pulse sequences described herein can be used to obtain breath-hold single slice MM T1rho and/or T2 relaxometry of a subject of interest, with suppression of blood signal. Suppression of blood signal can be achieved as a consequence of the pulse sequence and/or by incorporating data from additional pulse sequences. Data acquisition can be fast enough that a single slice can be completed in a breath-hold (a scan time short enough that most patients will be able to hold their breath for the duration of the scan), which can reduce spatial misregistration. In some embodiments, the anatomy of interest may be the liver of a patient; however, it is to be understood that techniques described herein can be applied to other organs and tissues.

Figure 1:
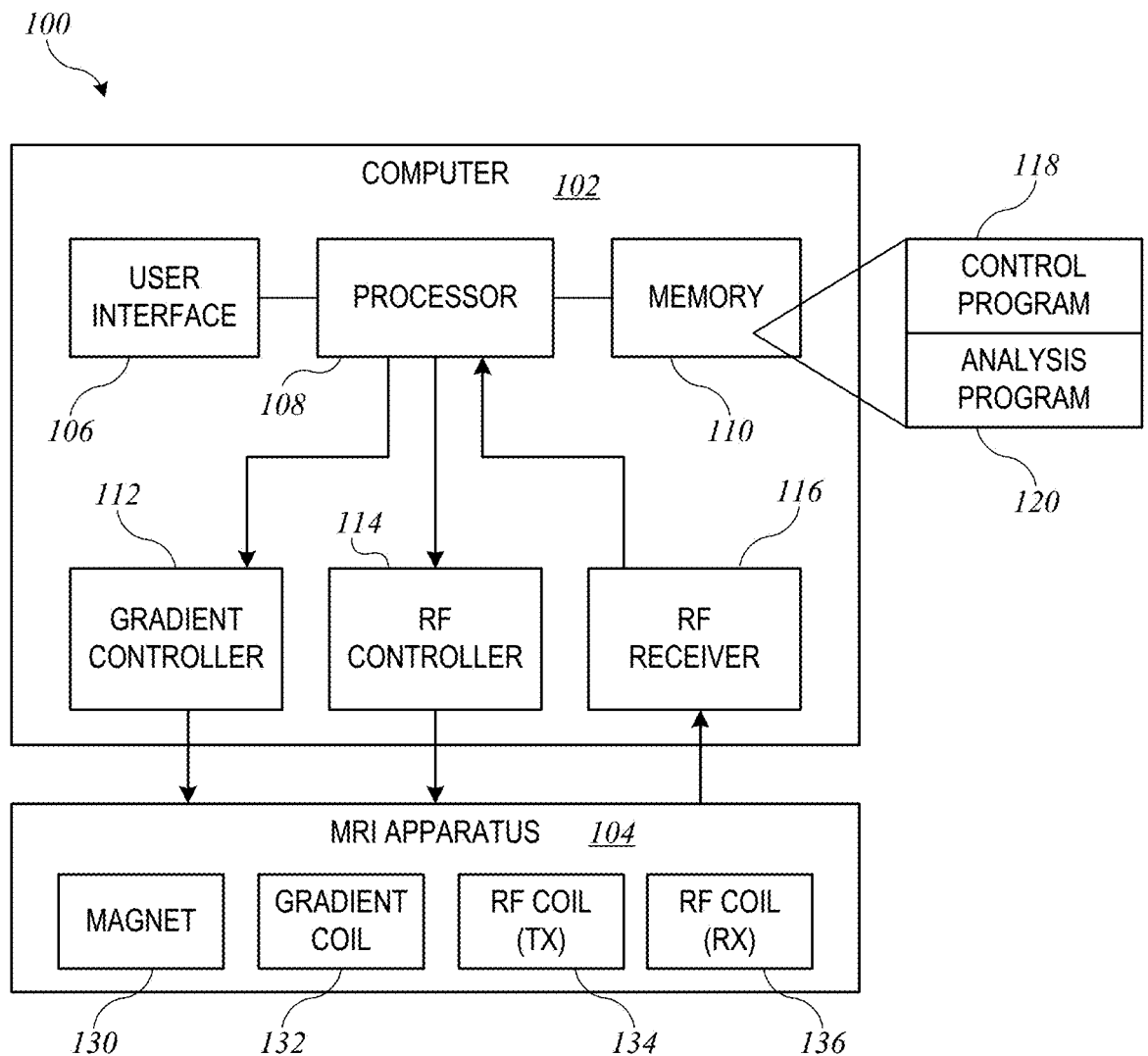
FIG. 1 shows an MM system that can be used in connection with practicing some embodiments of the present invention.

FIG. 1 shows an MM system 100 that can be used in connection with practicing some embodiments of the present invention. MRI system 100 includes a computer 102 communicably coupled to an MRI apparatus 104.

Computer 102 can be of generally conventional design and can include a user interface 106, a processor 108, a memory 110, a gradient controller 112, an RF controller 114, and an RF receiver 116. User interface 106 can include components that allow a user (e.g., an operator of MRI system 100) to input instructions or data and to view information. For example, user interface 106 can include a keyboard, mouse, joystick, display screen, touch-sensitive display screen, and so on. Processor 108 can include one or more general purpose programmable processors capable of executing program code instructions to perform various operations. Memory 110 can include a combination of volatile and nonvolatile storage elements (e.g., DRAM, SRAM, flash memory, magnetic disk, optical disk, etc.). Portions of memory 110 can store program code to be executed by processor 108. Examples of the program code can include a control program 118, which can coordinate operations of MRI apparatus 104 as described below in order to acquire data, and an analysis program 120, which can perform analysis algorithms on data acquired from MM apparatus 104. Gradient controller 112, RF controller 114, and RF receiver 116 can incorporate standard communication interfaces and protocols to communicate with components of MRI apparatus 104 as described below.

MRI apparatus 104 can be of generally conventional design and can incorporate a magnet 130, one or more gradient coils 132, and RF coils 134, 136. Magnet 130 can be a magnet capable of generating a large constant magnetic field $B_0$ (e.g., 1.5 T, 3.0 T, or the like) in a longitudinal direction, in a region where a patient can be placed. Gradient coils 132 can be capable of generating gradients along the direction of the constant magnetic field $B_0$; operation of gradient coils 132 can be controlled by computer 102 via gradient controller 112. RF coils 134, 136 can include a transmitter (TX) coil 134 and a receiver (RX) coil 136. In some embodiments, a single coil can serve as both transmitter and receiver. In some embodiments, RF transmitter coil 134 can be placed around the portion of the subject's body that is to be imaged while RF receiver coil 136 is placed elsewhere within MM apparatus 104. The preferred placement of RF coils 134, 136 may depend on the specific portion of the body that is to be imaged; those skilled in the art with access to the present disclosure will be able to make appropriate selections.

In operation, computer 100 can drive gradient coils 132 using gradient controller 112 to shape the magnetic field around the region being imaged. Computer 100 can drive RF transmitter coil 134 using RF controller 114 to generate RF pulses at a resonant frequency for an isotope of interest, driving nuclear spins into an excited state. RF receiver coil 136 can detect RF waves (or pulses) generated by the spins relaxing from the excited state when RF pulses are not being generated. RF receiver 116 can include amplifiers, digital-to-analog converters, and other circuitry to generate digital data from the RF waves detected by RF receiver coil 136. RF receiver 116 can provide this data to processor 108 for analysis.

MRI system 100 is illustrative, and many variations and modifications are possible. Those skilled in the art will be familiar with a variety of MRI apparatus and with basic principles of MRI data acquisition, including the use of gradient fields and RF pulses, as well as techniques for detecting signals responsive to RF pulses and processing those signals to generate images.

In accordance with some embodiments of the present invention, MM system 100 or other MM apparatus can be used to generate a pulse sequence suitable for T1rho and/or T2 imaging of a specific organ or tissue within a patient, such as the liver.

Figure 2:
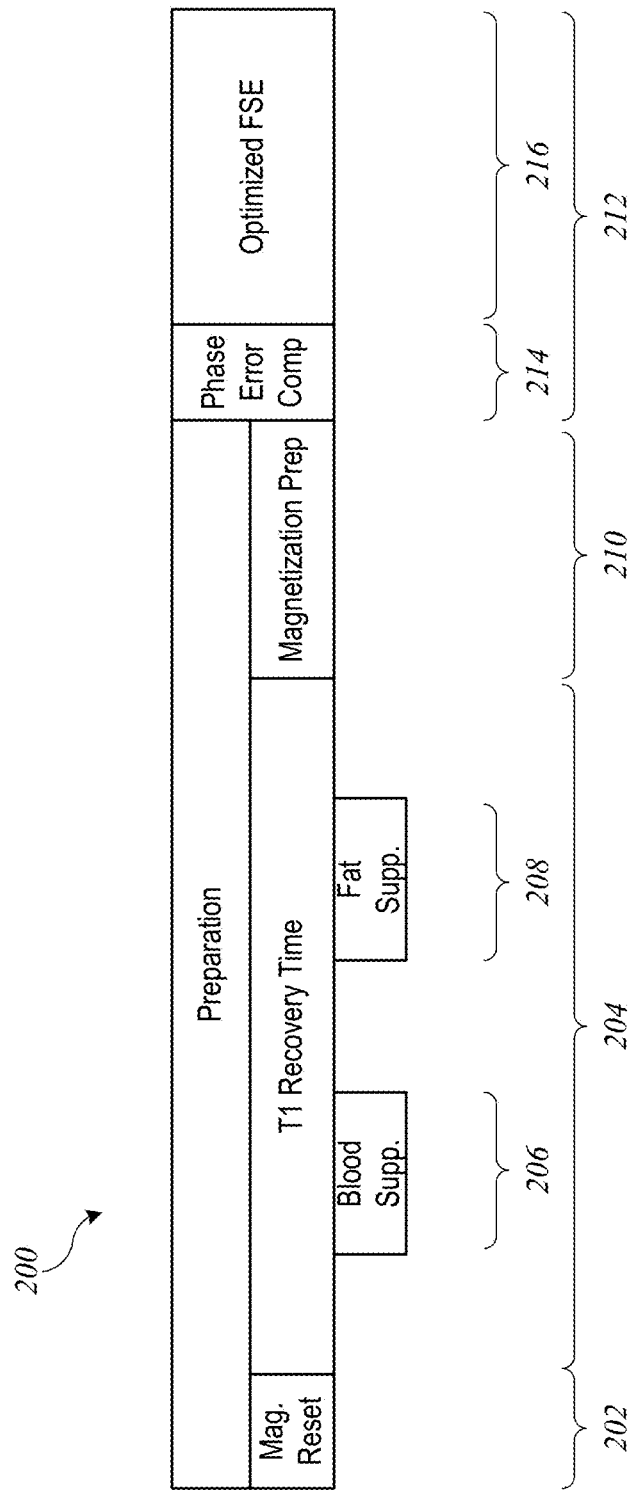
FIG. 2 shows a scheme diagram of a pulse sequence suitable for MRI T1rho or T2 relaxometry of a patient's liver according to an embodiment of the present invention.

FIG. 2 shows a scheme diagram of a pulse sequence 200 suitable for quantitative MRI relaxometry (including T1rho and/or T2) with black blood effect according to an embodiment of the present invention. It is to be understood that the scheme diagrams are not necessarily to scale in either pulse magnitude (vertical axis) or time (horizontal axis).

Pulse sequence 200 begins with a magnetization reset portion 202, which can include a 90 degree RF pulse followed by crusher gradients to reset the net magnetization.

Magnetization reset portion 202 can be followed by a T1 recovery portion 204. T1 recovery portion 204 can be a long recovery time to allow longitudinal signal recovery, e.g., from a few hundred to a few thousand milliseconds. During T1 recovery portion 204, a blood suppression pulse sequence 206 can be applied to generate a blood suppression effect. In some embodiments, blood suppression pulse sequence 206 can be a conventional double inversion recovery (DIR) pulse sequence. Other blood suppression techniques, such as blood suppression based on T1 nulling, motion-sensitized driven equilibrium (MSDE), or delay alternating with nutation for tailored excitation (DANTE), can also be incorporated into this pulse sequence for blood suppression. In addition or instead, a fat suppression pulse sequence 208 can be applied to generate a fat suppression effect. In some embodiments, fat suppression pulse sequence 208 can be a conventional spectral attenuated inversion recovery (SPAIR) pulse sequence. In some embodiments, additional fat suppression can be achieved by employing a gradient reversal technique in addition to SPAIR. (A description of a gradient reversal technique can be found in Park et al., "Gradient reversal technique and its application to chemical shift related NMR imaging," *Magn. Reson. Med.* 4(6):526-536 (1987).) Examples of DIR and SPAIR pulse sequences, and other sequences usable for blood or fat suppression are known in the art.

T1 recovery portion 204 can be followed by a magnetization prep portion 210, which can include T1rho prep and/or T2 prep. In some embodiments, magnetization prep portion 210 can include an RF pulse cluster which has simultaneous compensation of $B_1$ RF and $B_0$ field inhomogeneity. The particular compensation will be implementation dependent. Examples are described in Witschey et al., "Artifacts in T1ρ weighted imaging: Compensation for B1 and B0 field imperfections," *J. Magn. Reson.* 186:75-85 (2007), and in Chen et al., "Quantitative T1ρ imaging using phase cycling for B0 and B1 field inhomogeneity compensation," *Magn. Reson. Imag.* 29(5):608-619 (2011).

Magnetization prep portion 210 can be followed by signal acquisition portion 212. According to certain embodiments, signal acquisition can be performed using an FSE pulse sequence 216, such as a single shot fast spin echo (SSFSE) sequence. In some embodiments, a multi-shot FSE sequence can be used instead. Parameters of the FSE sequence can be selected to optimize T1rho quantification; examples are described below. In some embodiments, the FSE pulse sequence can be preceded by a phase compensation sequence 214. Examples of suitable phase compensation sequences are known in the art.

In some embodiments, magnetization prep portion 210 may include crusher gradients near the end, which can result in short-term eddy currents that may affect data acquisition. In some embodiments, a delay (e.g., 2 ms) can be added after magnetization prep portion 210 to allow the eddy currents to decay.

Either a single-shot or multi-shot FSE sequence can be used for signal acquisition. One advantage of FSE is that blood flow cannot maintain the Carr Purcell Meiboom Gill (CPMG) condition (the phase error accumulates), while other tissue can; as a result, FSE can inherently provide a black blood effect. In some instances, FSE may not sufficiently provide a black blood effect, and DIR sequence 206 or other blood suppression sequences can be used to further improve the black blood effect.

Figure 3:
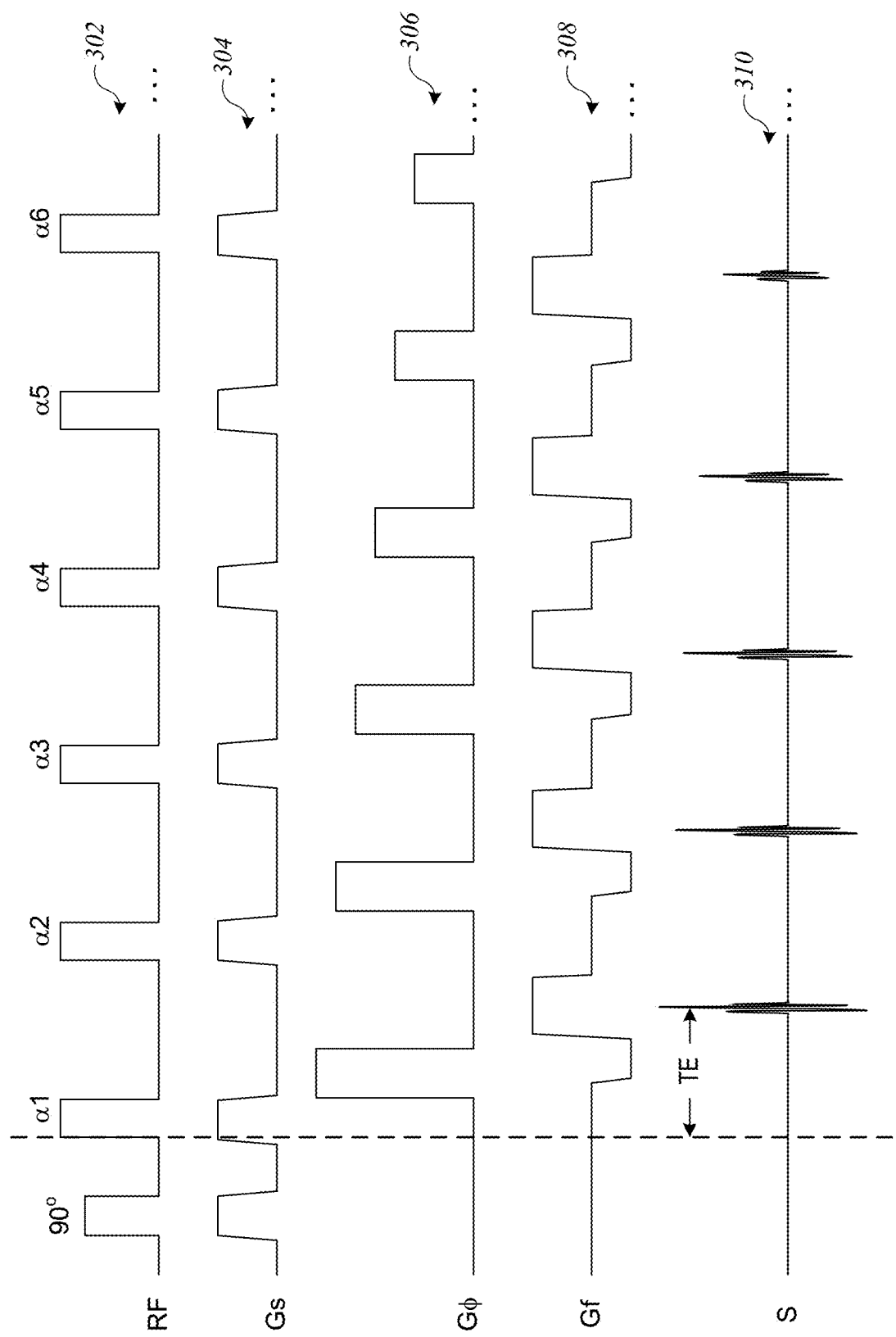
FIG. 3 shows a scheme diagram of an FSE pulse sequence that can be used in some embodiments of the present invention.

FIG. 3 shows a scheme diagram of an SSFSE pulse sequence that can be used as sequence 216 according to an embodiment of the present invention. (Multi-shot FSE differs in that multiple excitation pulses are included.) A train of RF pulses 302 can be generated in RF transmitter coil 134. The first pulse can be a 90° excitation pulse that generates transverse magnetization, and each succeeding pulse can be a refocusing pulse with a flip angle $\alpha_i$ (i=1, 2, p), where p is the total number of refocusing pulses in the train. (Those skilled in the art will be able to select an appropriate number p of refocusing pulses based on field of view, resolution, image sharpness, and scan time.) Gradient pulses can be applied using gradient coils 132 to define a slice of the tissue to be imaged (Gs, timeline 304), phase (Gφ, timeline 306), and frequency (Gf, timeline 308). An RF signal (S, timeline 310) responsive to each RF pulse can be detected using RF receiver coil 136. Each signal pulse in timeline 210 occurs at an echo time (TE) after the refocusing pulse to which it is responsive.

In FSE acquisition, two main factors affecting suppression of blood signal include the flip angles $\alpha_i$ of the refocusing pulses and the echo time TE. These same parameters can also be useful for reducing image blurring. It can be shown that for the pulse sequences described herein, the choice of flip angles $\alpha_i$ of the refocusing pulses and the echo time TE do not significantly affect T1rho quantification, as long as the signal-to-noise ratio (SNR) is sufficient. As a result, it is possible to optimize the pulse sequence to obtain blood suppression (also referred to as black blood effect) without degrading the image quality.

This can be demonstrated using the extended phase graph algorithm (EPG). This algorithm is described, e.g., in Busse et al., "Fast spin echo sequences with very long echo trains: design of variable refocusing flop angle schedules and generation of clinical T2 contrast," *Magn. Reson. Med.* 55(5):1030-1037 (2006). In this algorithm, $F_k^{(n)}$ and $Z_k^{(n)}$ can be defined as the kth-order configuration of the transverse magnetization and longitudinal magnetization, respectively. The signal at the nth echo within the echo train is characterized by the 0th-order transverse configuration $F_0^{(n)}$. If the magnetization after the 90° excitation RF pulse is purely transverse, then:

$$F_k^{(0)} = \begin{cases} M_{prep}, & k = 0 \\ 0, & k \neq 0 \end{cases} \quad (1a)$$

and $$Z_k^{(0)} = 0 \quad (1b)$$

where $M_{prep}$ is the magnetization after T1rho-prep (e.g., after sequence portion 210 of FIG. 2). The transverse and longitudinal configurations at the nth echo in the echo train, $F_k^{(n)}$ and $Z_k^{(n)}$, can be calculated as linear combinations of the configurations at the (n−1)th echo, based on the physical processes involved, which include precession due to gradient and off-resonance fields, nutation due to refocusing RF pulses, and T1 and T2 relaxation. By iteratively applying these linear operations, starting from the initial conditions of Equations (1a) and (1b), the transverse signal at the nth echo can be expressed as:

$$M_{xy}^{(n)} = A(T1, T2, \alpha_1, \alpha_2 \ldots \alpha_{n-1}) M_{prep} \quad (2)$$

where $\alpha_i$ are the flip angles of the refocusing RF pulses and $A(T1, T2, \alpha_1, \alpha_2 \ldots a_{n-1})$ is a constant scaling factor that is a function of T1, T2 and the refocusing flip angles.

B1 inhomogeneity causes the flip angle of the excitation RF pulse to deviate from 90°. If the flip angle of the excitation RF pulse is denoted as θ, then:

$$F_k^{(0)} = \begin{cases} M_{prep}\cos\theta, & k = 0 \\ 0, & k \neq 0 \end{cases} \text{ and} \quad (3a)$$

$$Z_k^{(0)} = \begin{cases} M_{prep}\sin\theta, & k = 0 \\ 0, & k \neq 0 \end{cases} \quad (3b)$$

Similarly to the derivation of Equation (2), Equations (3a) and (3b) lead to:

$$\begin{aligned} M_{xy}^{(n)} &= C_1(T1, T2, \alpha_1, \alpha_2\ldots\alpha_{n-1})M_{prep}\cos\theta + \\ &\quad C_2(T1, T2, \alpha_1, \alpha_2\ldots\alpha_{n-1})M_{prep}\sin\theta \\ &= A(\theta, T1, T2, \alpha_1, \alpha_2\ldots\alpha_{n-1})M_{prep} \end{aligned} \quad (4)$$

where $A(\theta, T1, T2, \alpha_1, \alpha_2 \ldots a_{n-1})$ is a constant scaling factor that is a function of θ, T1, T2 and the refocusing flip angles.

Equations (2) and (4) indicate that non-90° excitation induced by B1 inhomogeneity, the choice of echo time, and the refocusing flip angles only affect the scaling and not the relaxation profile stored in $M_{prep}$. Therefore, if $M_{prep}$ is a mono-exponential decay function of the time of spin lock (TSL), then quantification of T1rho by fitting data to a mono-exponential relaxation model is valid if imaging data is acquired using FSE. It should be noted that the same considerations apply to quantification of other relaxation properties, such as T2; accordingly, quantification of T2 by fitting data to a mono-exponential relaxation model is also valid if imaging data is acquired using FSE.

Figure 4:
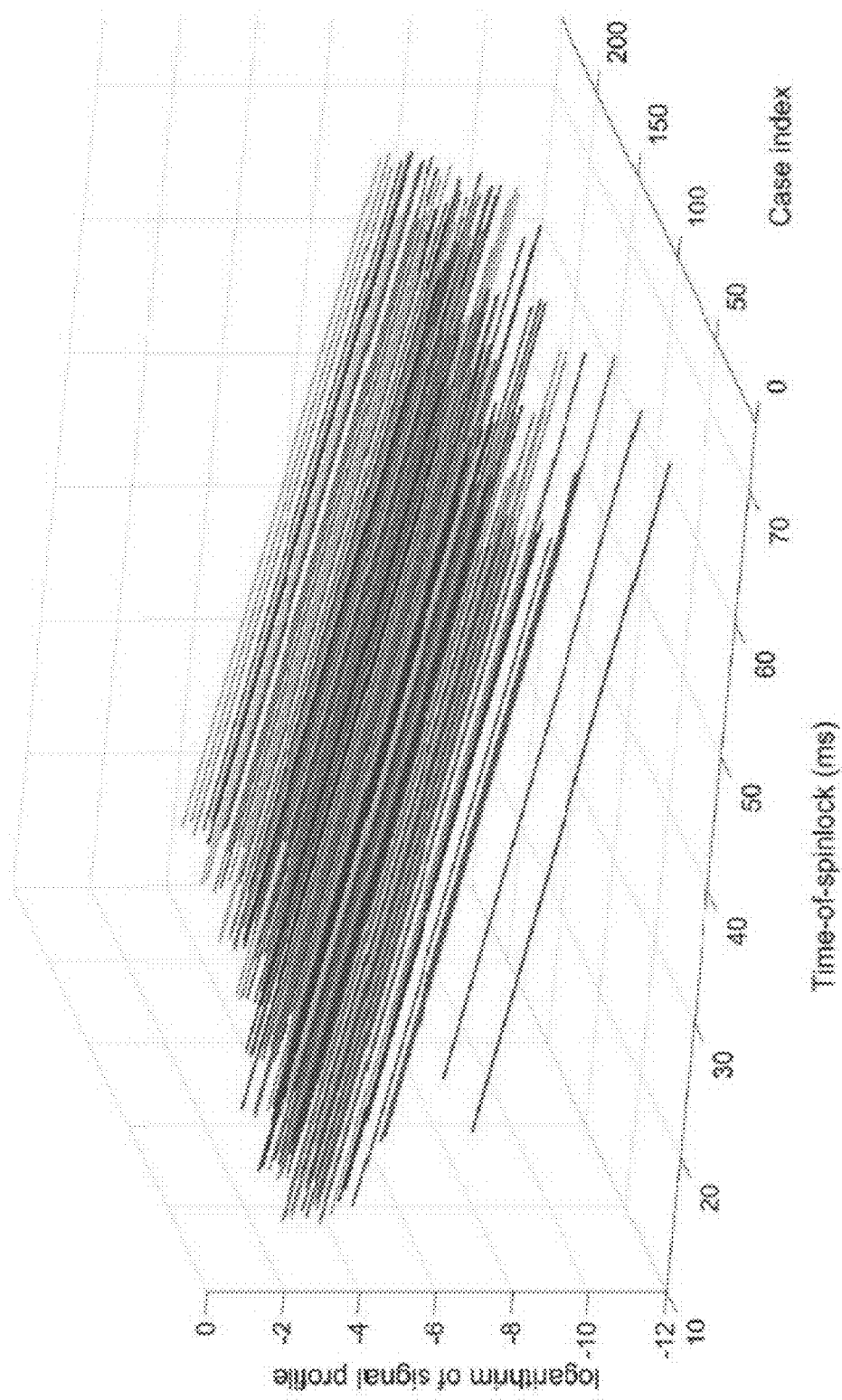
FIG. 4 shows a graph illustrating that a T1rho measurement is not affected by choices of certain pulse parameters for a pulse sequence according to an embodiment of the present invention.

FIG. 4 shows a graph illustrating the property described by Equations (2) and (4). For $M_{prep} = e^{-TSL/T1rho}$, the signal-profile along the FSE echo train was calculated using the EPG algorithm for a set of example cases (each corresponding to a case index). Each case can be characterized by a choice of the excitation and refocusing flip angles. Across the set of cases, the refocusing flip angle trains ranged from 75° to 180°, and the excitation RF flip angle ranged from 60° to 120°. For each case, the logarithm of the signal at a given echo along the echo train is shown as a function of time of spin lock. As can be seen, the signal profile for each case has a constant slope, and the slope is the same across all cases. This illustrates the property that for any given echo along the echo train, regardless of flip angles, the relaxation rate in the mono-exponential decay imparted in $M_{prep}$ is preserved accurately. While FIG. 4 shows results for specific calculations using T1rho, it is to be understood that the same property holds for T2.

This property of FSE is advantageous as compared to certain other acquisition sequences, such as fast gradient echo based acquisitions, where T1 relaxation during the echo train can compromise the magnetization contrast imparted by the T1rho-prep (or T2-prep), resulting in a more complicated signal profile and/or longer scan times to collect additional data in order to separate T1 and T1rho effects (or T1 and T2 effects). In addition, FSE can provide higher signal-to-noise ratio (SNR). FSE can also enable the gradient reversal method to suppress fat signal after magnetization preparation, which can further improve T1rho quantification of the liver, which is sensitive to chemical shift artifacts.

Figures 5A, 5B:
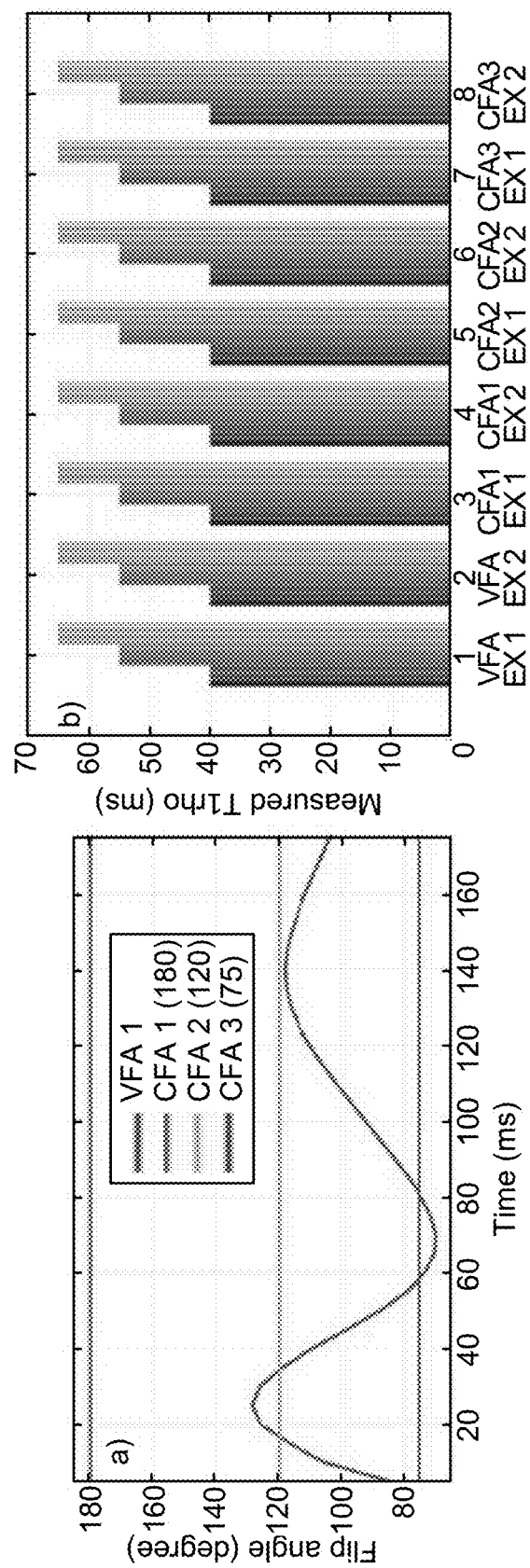
FIGS. 5A and 5B show an example of simulations of T1rho quantification for three different tissue samples according to an embodiment of the present invention.

The EPG algorithm can also be used to simulate signal profiles in various tissue types. FIGS. 5A and 5B show an example of simulations for three different tissue samples, defined to have the characteristics shown in Table 1:

TABLE 1

| Sample | T1 (ms) | T2 (ms) | T1rho (ms) |
|---|---|---|---|
| A (indigo) | 900 | 35 | 40 |
| B (teal) | 1200 | 45 | 55 |
| C (yellow) | 1600 | 55 | 65 |

The EPG algorithm was used to simulate signal profiles after T1rho-prep. Magnetization was prepared for four different time of spin lock (TSL) values: 0, 10, 35, and 75 ms. FIG. 5A shows a graph representing four different schemes of refocusing flip angle trains that were used: a constant flip angle of 75° (labeled CFA3), a constant flip angle of 120° (labeled CFA2), a constant flip angle of 180° (labeled CFA1), and a variable flip angle (labeled VFA). Two flip angles of the excitation RF pulse were used (EX1=60° and EX2=90°), and three echo times (15, 25, and 35 ms) were used. Each simulated signal profile was Fourier-transformed to the spatial domain and fit to a mono-exponential decay model to quantify T1rho. FIG. 5B shows the calculated T1rho for each tissue type, for multiple different scenarios. Each of the 8 groups of bars corresponds to the indicated combination of excitation RF pulses and flip angle trains. The calculated T1rho is shown separately for each of the three echo times, and the color coding indicates which of the sample tissue characteristics from Table 1 was used. As can be seen, the calculated T1rho values are a good match to the values shown in Table 1, regardless of the excitation RF pulse flip angle, refocusing flip angles, or echo time. Thus, these parameters can be freely tuned to achieve other desired effects (e.g., reduced blurring and/or black blood effect) without degrading the T1rho quantification. While FIG. 5B shows results for a simulation quantifying T1rho, it is to be understood that T2 quantification yields similarly robust results.

Figure 6:
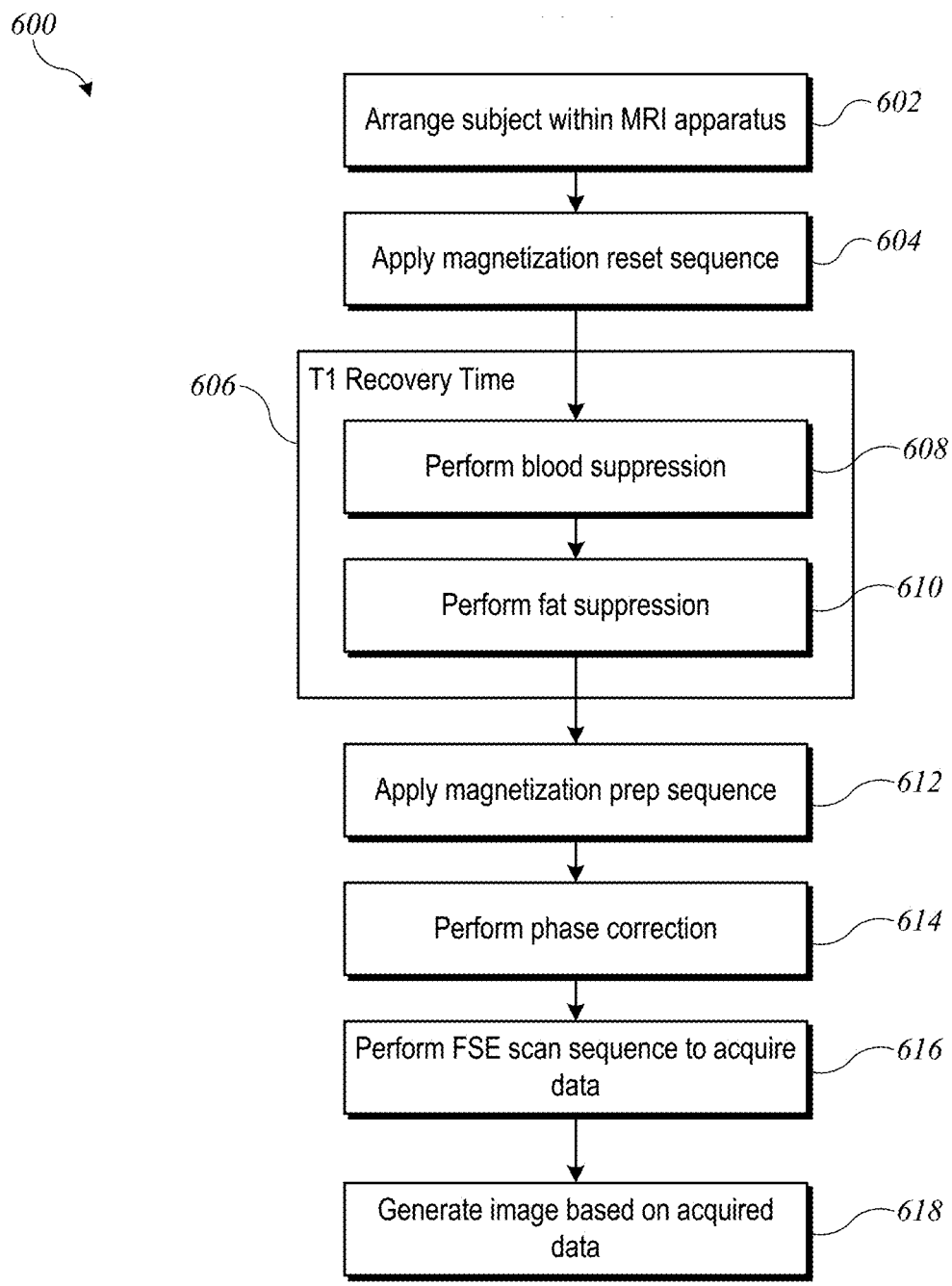
FIG. 6 shows a flow diagram of a process for generating an MRI image according to an embodiment of the present invention.

FIG. 6 shows a flow diagram of a process 600 for generating an MRI image according to an embodiment of the present invention. Process 600 can be implemented using an MM system such as system 100 of FIG. 1. At block 602, a subject whose tissue is to be imaged is arranged within an Mill apparatus. This can include having the patient assume a supine position and aligning the patient within the MM apparatus. In some embodiments, this may also include positioning of RF and/or gradient coils; the particular positioning will depend on what tissue is being imaged.

At block 604, a magnetization reset sequence (e.g., sequence portion 202 described above) can be applied. During a T1 recovery time associated with the magnetization reset sequence (block 606), blood suppression can be performed at block 608, e.g., using blood suppression sequence 206 as described above. Additionally or instead, fat suppression can be performed at block 608, e.g., using fat suppression sequence 208 as described above. Blood suppression and fat suppression sequences can be applied in either order, and in some embodiments, either or both of blood suppression and fat suppression can be omitted. After the T1 recovery time, a magnetization prep sequence can be applied at block 612, e.g., corresponding to magnetization prep sequence 210 of FIG. 2. The magnetization prep sequence can be a T1rho prep sequence or a T2 prep sequence, depending on the particular relaxometry desired. At block 614, the magnetization prep sequence can be followed by a phase correction operation, e.g., phase error compensation 214 of FIG. 2. At block 616, an FSE scan sequence (including single-shot or multi-shot FSE (TSE)) can be performed as described above to acquire data. In some embodiments, the scan sequence acquires data for a single cross-sectional slice of the tissue of interest. The dimensions and orientation of the slice depend on the alignment of the various fields, as is known in the art. If desired, the operations of any or all of blocks 604-616 can be repeated to acquire data for additional slices. At block 618, an image can be generated based on the acquired data. Conventional techniques for analyzing the acquired data can be employed, including Fourier transform of acquired k-space data and fitting to a mono-exponential decay model to determine T1rho or T2 at a specific location within the imaged area. In some embodiments, in addition to or instead of generating a visible image, other data such as a quantification of T1rho or T2 across some region of interest can be generated. This data can be made available to a user at a local interface of the MRI apparatus, stored, and/or transmitted elsewhere for analysis as desired.

In vivo testing of a pulse sequence according to an embodiment of the present invention has been performed on a set of volunteer subjects. For purposes of testing, a Philips Achieva TX 3.0 T scanner equipped with a dual transmitter (available from Philips Healthcare, Best, the Netherlands) was used. A 32-channel cardiac coil (available from Invivo Corp. of Gainesville, Fla.) was used as the receiver RF coil, and a body coil was used as the RF transmit coil. RF shimming was applied to reduce B1 inhomogeneity. The subjects were scanned in a supine position. Two-dimensional axial images of the subjects' livers were acquired with phase encoding along anterior-posterior direction. Four sets of images with TSL of 0, 10, 30, and 50 ms were acquired for T1rho quantification. (Other spin lock times can also be used, e.g., up to 60 ms.) The spin lock frequency was 500 Hz. Parameters for MRI imaging included: TR=2500 ms; TE=15 ms; in-plane resolution=1.5 mm×1.5 mm; slice thickness=6 mm; SENSE acceleration factor=2, half-scan factor (partial Fourier)=0.6; number of signal averaging=1; delay time for SPAIR=250 ms; and delay time for DIR=720 ms. The k-space was scanned in low-high profile order (i.e., starting with the center of k-space, then gradually stepping to the high-frequency region). Data sets were acquired with different levels of blood suppression. Single-slice T1rho data sets with four spin lock times were acquired within a single breath-hold time of 10 seconds.

In addition to the liver scans, in vivo knee scans were also performed. Knee scans were performed using a transceiver knee coil (available from Invivo Corp.). The knee scan was repeated 61 times with excitation flip angle ranging from 65° to 125°, the refocusing flip angle ranging from 50° to 120°, and TE ranging from 5 to 30 ms. The same imaging parameters described above were used for the knee scans.

Image analysis can be performed using conventional techniques for MRI image analysis. In this example, the analysis was implemented using MATLAB R2015a (available from The MathWorks, Inc., of Natick, Mass.). For liver data, a small window with size 4×4 was used to smooth the images to increase SNR prior to T1rho quantification. The four images with different TSL were fitted to a mono-exponential model to calculate T1rho maps. Nonlinear least squares fit with the Levenberg-Marquardt algorithm was used for the fitting. (Those skilled in the art will appreciate that other algorithms can be substituted.)

For the 61 knee scans, T1rho was measured on three regions of interest (ROI) selected from different groups of muscle. The three ROIs were chosen to have relatively uniform tissue distribution, and the mean image intensity of each ROI was fit to a mono-exponential model to calculate a mean T1rho value within the ROI. The mean and standard deviation of the measured T1rho values within the three ROIs across 61 experiments were 32.3±0.4 ms, 31.2±0.3 ms, and 31.5±0.4 ms, respectively. The corresponding coefficients of variation (CV) were 1.29%, 1.03%, and 1.33%, respectively.

Figure 7:
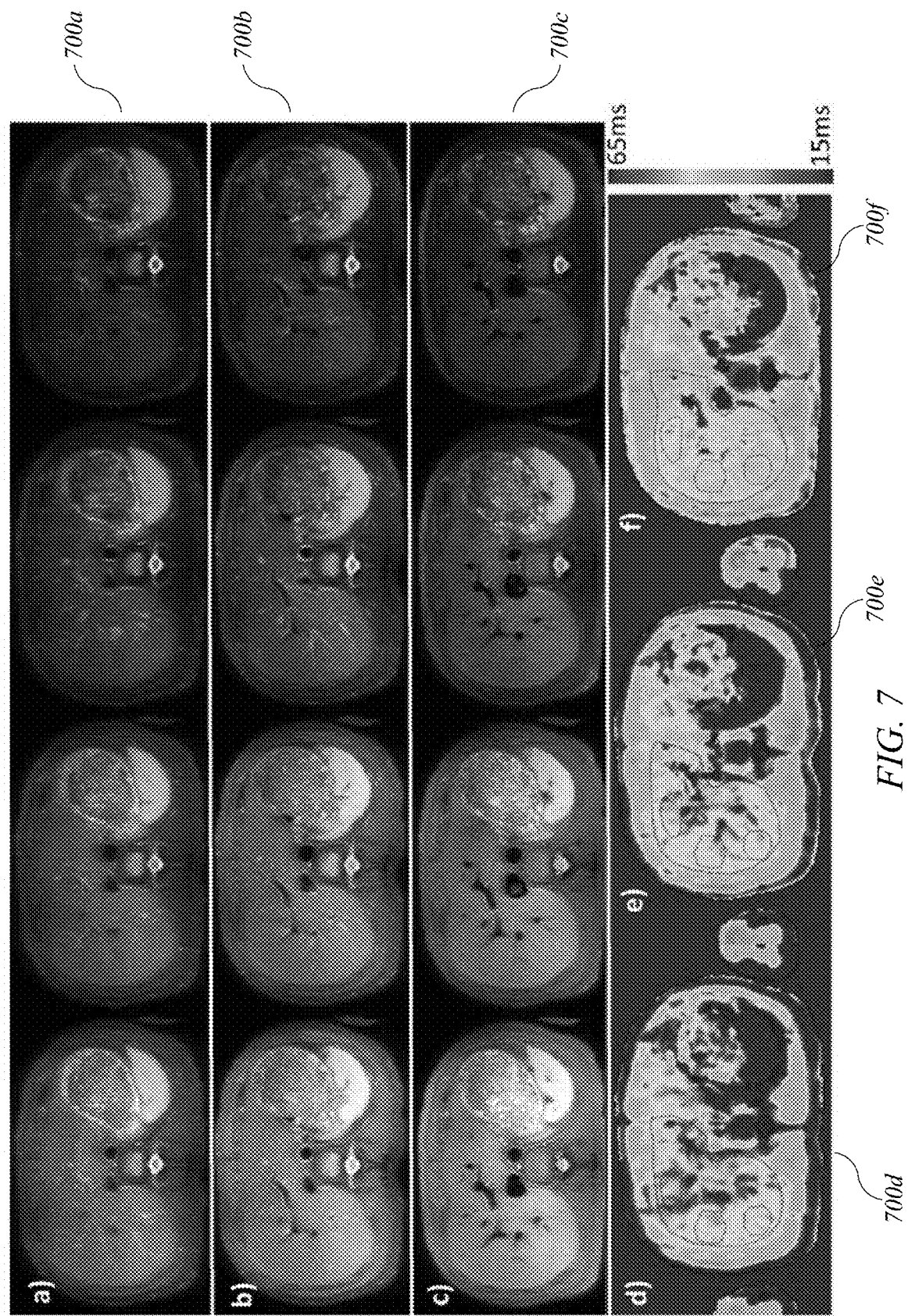
FIG. 7 shows examples of images generated from data acquired during liver scans according to various embodiments of the present invention.

Examples of T1rho-prepped images generated from data acquired during liver scans according to an embodiment of the present invention are shown in FIG. 7. The images in row 700a were based on data acquired with refocusing flip angle of 120°, without DIR, with TSLs of 0, 10, 30, and 50 ms (left to right). The images in row 700b were based on data acquired with refocusing flip angle of 90°, without DIR, with TSLs of 0, 10, 30, and 50 ms (left to right). The images in row 700c were based on data acquired with refocusing flip angle of 75°, with DIR, and with TSLs of 0, 10, 30, and 50 ms (left to right). In all three rows, the echo time was 15 ms. It should be noted that the use of DIR in combination with reduced refocusing flip angle (row 700c) yields improved blood suppression and improved image sharpness as compared to the other examples (rows 700a and 700b).

Image 700d shows a T1rho map measured from the T1rho-prepped images in row 700a; image 700e shows a T1rho map measured from the T1rho-prepped images in row 700b; and image 700f shows a T1rho map measured from the T1rho-prepped images in row 700c. For each T1rho map, three corresponding regions of interest (ROI) were selected (small regions with solid outlines). For the three ROIs in image 700d, the T1rho values were determined to be 53.8±4.1 ms, 47.4±1.5 ms, and 47.8±2.3 ms, respectively. The goodness of fit within a larger ROI marked by a dashed line (encompassing the ROIs) was 0.978±0.007. For the three ROIs in image 700e, the T1rho values were determined to be 49.6±2.9 ms, 47.2±2.1 ms, and 47.7±3.1 ms, respectively. The goodness of fit within a larger ROI marked by a dashed line was 0.985±0.050. For the three ROIs in image 700f, the T1rho values were determined to be 45.8±2.6 ms, 44.5±3.7 ms, and 43.8±1.2 ms, respectively. The goodness of fit within a larger ROI marked by a dashed line was 0.992±0.021. It is noted that the improved blood suppression in image 700f reduces the T1rho value for liver parenchyma.

Reproducibility and repeatability of pulse sequences as described herein has also been studied by performing multiple scans of a set of test subjects. The measured T1rho value for these subjects was 39.9±2.4 ms. In a scan-rescan repeatability study, twelve subjects with healthy livers were rescanned twice in one session. A Bland-Altman plot showed a scan-rescan repeatability mean difference of 0.025 ms, with an associated intraclass correlation coefficient (ICC) of 0.977. In a scan-rescan reproducibility study, twelve subjects with healthy livers were scanned twice in two sessions, with seven to ten days between sessions. A Bland-Altman plot showed a scan-rescan reproducibility mean difference of −0.075 ms and associated ICC of 0.820. An ICC value greater than 0.75 generally indicates good agreement, so the results suggest that T1rho measurements using pulse sequences as described herein are reproducible and repeatable.

As these examples suggest, it is possible to obtain a single slice T1rho map of liver tissue within a single breath-hold time of 10 seconds, for an MRI scan at 3.0 T field strength with 500 Hz spin lock frequency, and a TSL of 50 ms, within the SAR (specific absorption rate) limit.

As shown above, the FSE refocusing flip angles and echo time can be tuned without altering the relaxation model for T1rho quantification, allowing these parameters to be tuned to increase image quality. Since FSE sequences can also be used for anatomical assessment of the liver, the T1rho quantification provided by sequences and techniques described herein may allow an FSE sequence to be used for simultaneous biochemical and anatomical assessment of the liver.

As noted above, blood suppression can be improved by using a DIR sequence in combination with an FSE sequence, e.g., as shown in FIG. 2. Other techniques for blood suppression can be substituted, provided that they are compatible with other elements of the pulse sequence.

It should also be noted that reducing the flip angle in FSE acquisitions increases the sensitivity to motion. In the case of liver imaging, cardiac motion can result in shading in the upper abdominal region. In some embodiments, the effect of cardiac motion can be mitigated by applying cardiac gating techniques and collecting the FSE data during expiration phase, when cardiac motion is less significant.

Further, while the examples shown above provide quantification of T1rho, it is to be understood that other relaxation parameters, such as T2, can be measured using similar techniques, by modifying the magnetization preparation pulse sequence based on the particular relaxation parameter(s) to be measured.

More generally, tuning of pulse sequence parameters may involve tradeoffs between image qualities. For instance, variable flip angle may provide reduced blurring, reduced SAR, and improved SNR. Those skilled in the art will be able to perform such tuning for a particular application.

In some of the examples shown above, a DIR sequence is used for blood suppression. Use of SPAIR for fat suppression does not interfere with DIR, as SPAIR is played out after DIR and only inverts the fat signal. In other embodiments, other blood suppression sequences can be used. One example is motion-sensitized driven equilibrium (MSDE) or its improved version (iMSDE). Another example is delay alternating with nutation for tailored excitation (DANTE). These sequences may be played out after SPAIR, e.g., at the end of the T1 recovery period, to minimize interference.

Figure 8:
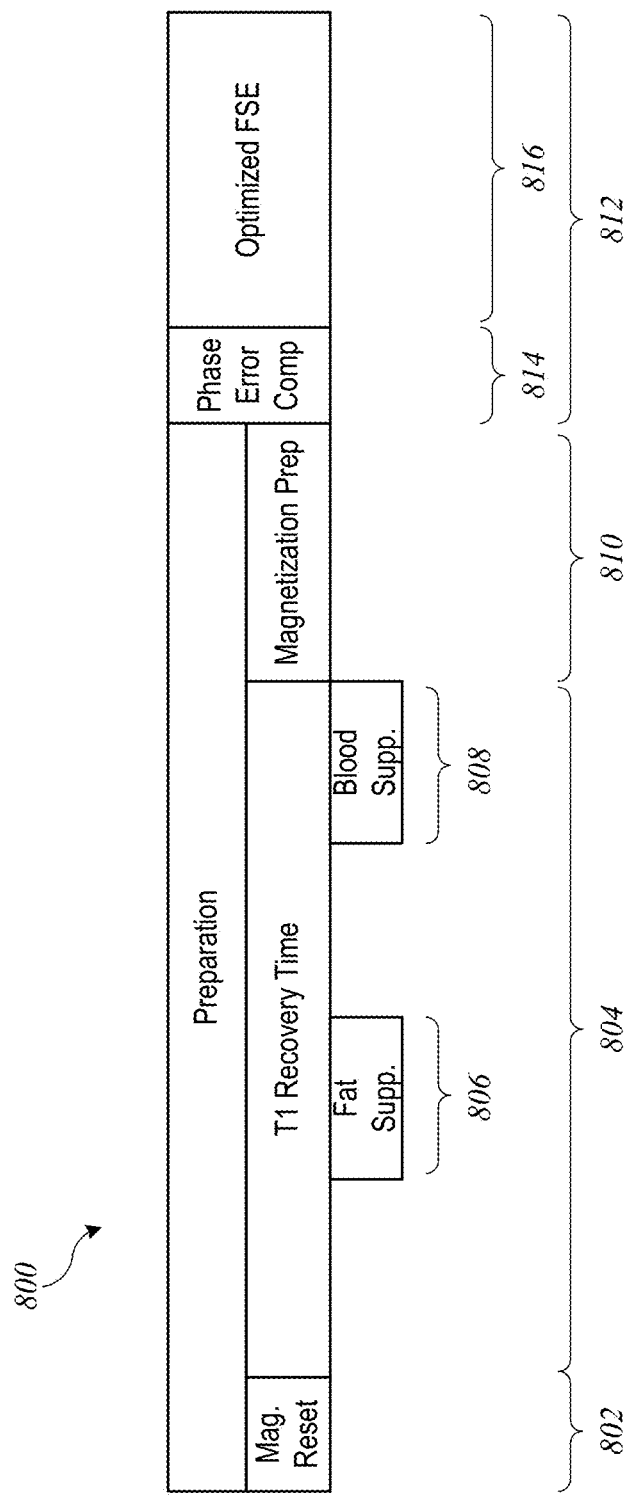
FIG. 8 shows a scheme diagram of a pulse sequence suitable for quantitative MRI relaxometry with black blood effect according to another embodiment of the present invention.

FIG. 8 shows a scheme diagram of a pulse sequence 800 suitable for quantitative MRI relaxometry (including T1rho and/or T2) with black blood effect according to another embodiment of the present invention. This pulse sequence can be similar in many respects to pulse sequence 200 as described above with reference to FIG. 2.

Pulse sequence 800 begins with a magnetization reset portion 802, which can be similar or identical to magnetization reset portion 202 described above. For example, magnetization reset portion 802 can include a 90 degree RF pulse followed by crusher gradients to reset the net magnetization.

Magnetization reset portion 802 can be followed by a T1 recovery portion 804. T1 recovery portion 804 can be a long recovery time to allow longitudinal signal recovery, e.g., from a few hundred to a few thousand milliseconds. During T1 recovery portion 204, a fat suppression pulse sequence 806 can be applied to generate a fat suppression effect. In some embodiments, fat suppression pulse sequence 806 can be a conventional SPAIR pulse sequence; a gradient reversal technique (e.g., as described above with reference to fat suppression pulse sequence 208 of FIG. 2) may also be employed. Other sequences usable for fat suppression, including sequences known in the art, may be used.

A blood suppression pulse sequence 808 can be applied near the end of T1 recovery portion 804. In some embodiments, the blood suppression pulse sequence may include an MSDE sequence, examples of which are described in Wang et al., "Improved suppression of plaque-mimicking artifacts in black-blood carotid atherosclerosis imaging using a multislice motion-sensitized driven equilibrium (MSDE) turbo spin-echo (TSE) sequence," *Magn. Reson. Med.* 58:973-981 (2007). In some embodiments, other blood suppression techniques may be used, such as delay alternating with nutation for tailored excitation (DANTE), examples of which are described in Li et al., "DANTE-prepared pulse trains: A novel approach to motion-sensitized and motion-suppressed quantitative magnetic resonance imaging," *Magn. Reson. Med.* 68(5):1423-1438 (2012).

T1 recovery portion 804 can be followed by a magnetization prep portion 810, which can include T1rho prep and/or T2 prep. In some embodiments, magnetization prep portion 810 can include pulse clusters similar or identical to those described above with reference to magnetization prep portion 210 of the pulse sequence of FIG. 2.

Magnetization prep portion 810 can be followed by signal acquisition portion 812. Signal acquisition portion 812 can be similar or identical to signal acquisition portion 212 of the pulse sequence of FIG. 2. For example, an SSFSE or multi-shot FSE pulse sequence 816 can be used, with parameters selected to optimize T1rho quantification, e.g., as described above. FSE pulse sequence 816 may be preceded by a phase compensation sequence 814.

In some embodiments, magnetization prep portion 810 may include crusher gradients near the end, which can result in short-term eddy currents that may affect data acquisition. In some embodiments, a delay (e.g., 2 ms) can be added after magnetization prep portion 810 to allow the eddy currents to decay.

The effect of including an MSDE sequence in a pulse sequence such as pulse sequence 800 has been modeled in simulation studies. The model is based on the classical full Bloch equation, which phenomenologically describes the net nuclear magnetization of a spin system with the presence of an RF magnetic pulse B1 applied in the transverse (xy) plane. For purposes of the model, monodirectional blood flow can be treated as a spin system composed of moving spins in a straight blood tube of diameter 5 mm. The flow can be oriented in any direction. For moving spins, the gradient term in the Bloch equation is modified to:

$$\vec{G}(t)=G(\chi_0+V(x)t), \quad (5)$$

where $\chi_0$ denotes different spatial locations across the blood tube, and $V(x)$ denotes the flow velocity distribution across the blood tube. The flow profile is designed such that the flow at the edges is assumed to be zero while flow at the center is at a maximum flow rate. The Bloch equation, modified by Eq. (5), can be used to model the effect of a pulse sequence such as that of FIG. 8.

In one simulation study, numerical programs were written using the MATLAB software package and used to study the effects of MSDE on T1rho quantification. T1rho is approximated by mono-exponential fitting of the value of $M_z$ after T1rho preparation into the equation $$M_z = M_{z0} e^{-\frac{TSL}{T1rho}}. \quad (6)$$

Parameters used in the model include T1(liver)=900 ms; T2(liver)=400 ms; T1(blood)=1932 ms; T2(blood) 275 ms; B1=13.5 μT; MSDE gradient G=20 mT with gradient duration of 4.5 ms. A crusher gradient is applied after the MSDE sequence with an area of 0.27 s*mT/m. Four different TSL values were used: 1, 10, 30, and 50 ms, with spin lock frequency of 500 Hz. (Other TSL values, e.g., up to 60 ms, may be used.)

Figure 9:
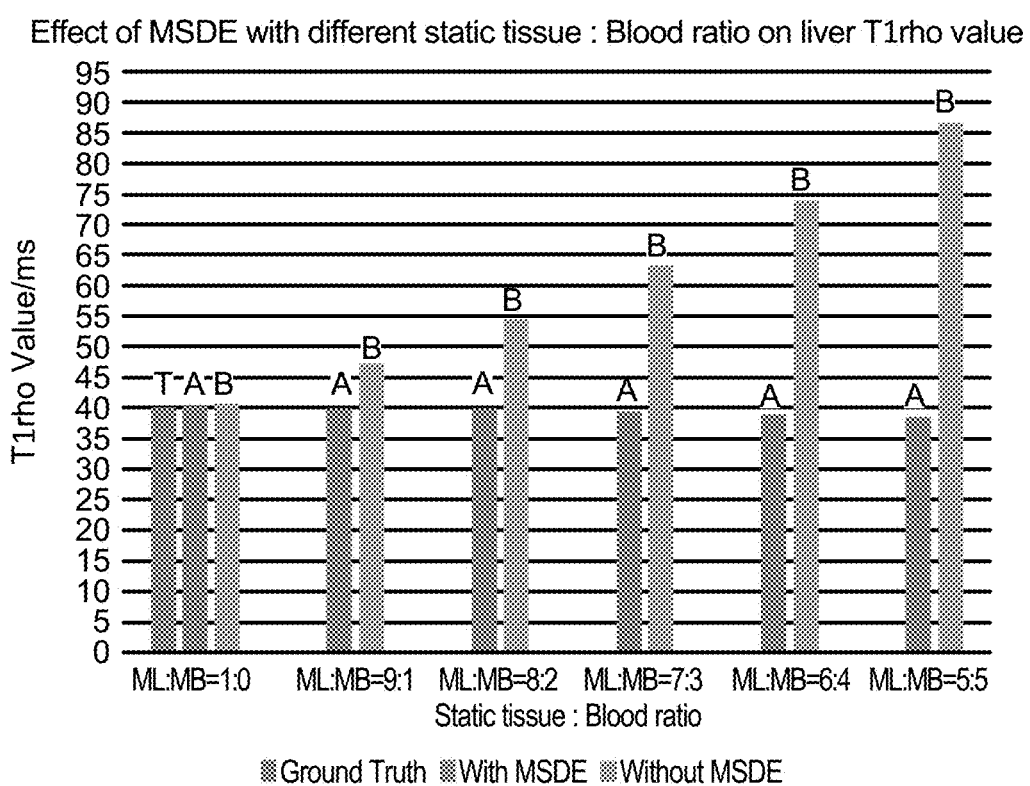
FIG. 9 shows a bar chart indicating the effect of a Motion-Sensitized Driven-Equilibrium (MSDE) blood suppression sequence on measurements of T1rho, from a simulation of a pulse sequence according to an embodiment of the present invention.

Results of the simulation are shown in FIGS. 9-12. FIG. 9 shows a bar chart indicating the effect of blood suppression using a MSDE sequence on measurements of T1rho. For each of five ratios of static (liver) tissue (ML) to moving (blood) tissue (MB), the T1rho measurements are shown with MSDE (bars labeled "A") and without MSDE (bars labeled "B"). The ground truth value of T1rho was 40 ms, as shown by the leftmost bar (labeled "T"). As can be seen, measurements without MSDE are strongly affected by the ratio ML:MB; as the blood contribution increases, the measured T1rho also increases. This does not occur for the measurements with MSDE, which remain approximately the same as the ground truth value for all ratios ML:MB.

Figure 10:
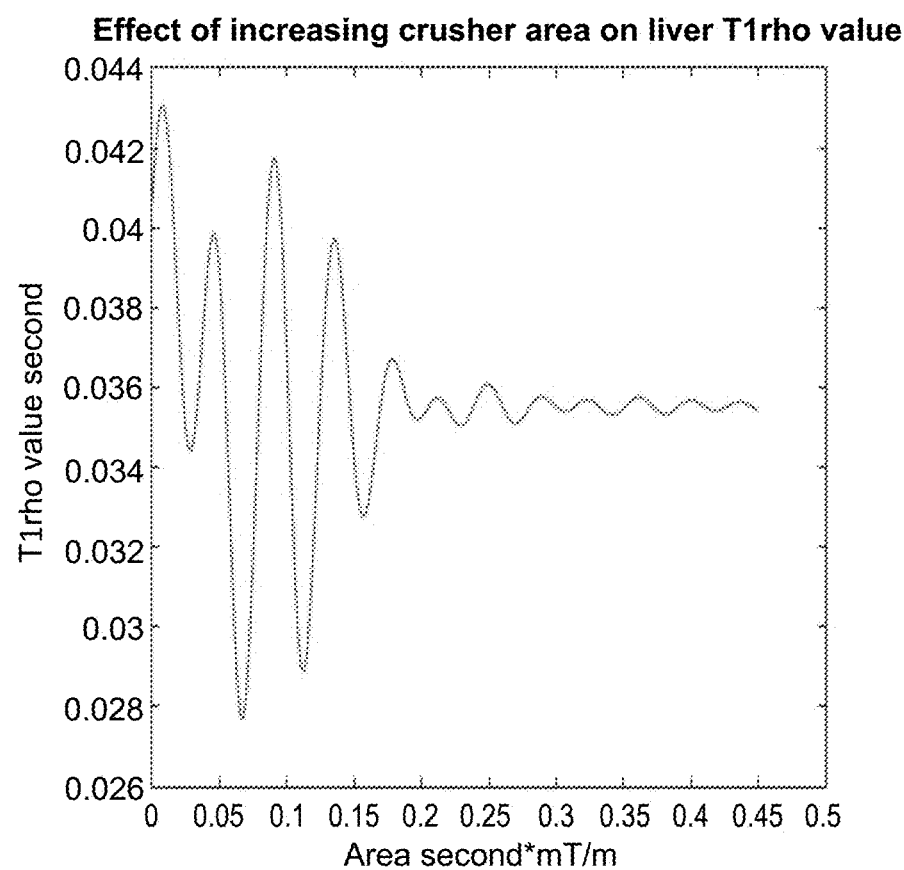
FIG. 10 shows a graph indicating the effect of increasing the crusher gradient area on measurements of T1rho, from a simulation of a pulse sequence according to an embodiment of the present invention.

FIG. 10 shows a graph indicating the effect of increasing the crusher gradient area on measurements of T1rho, with the x axis showing the area (in s*mT/m) and the y axis showing the measured T1rho value. For low areas, T1rho is subject to random oscillations. Due to the presence of B1 inhomogeneity, as the area increases, T1rho converges to approximately 37 ms.

Figure 11:
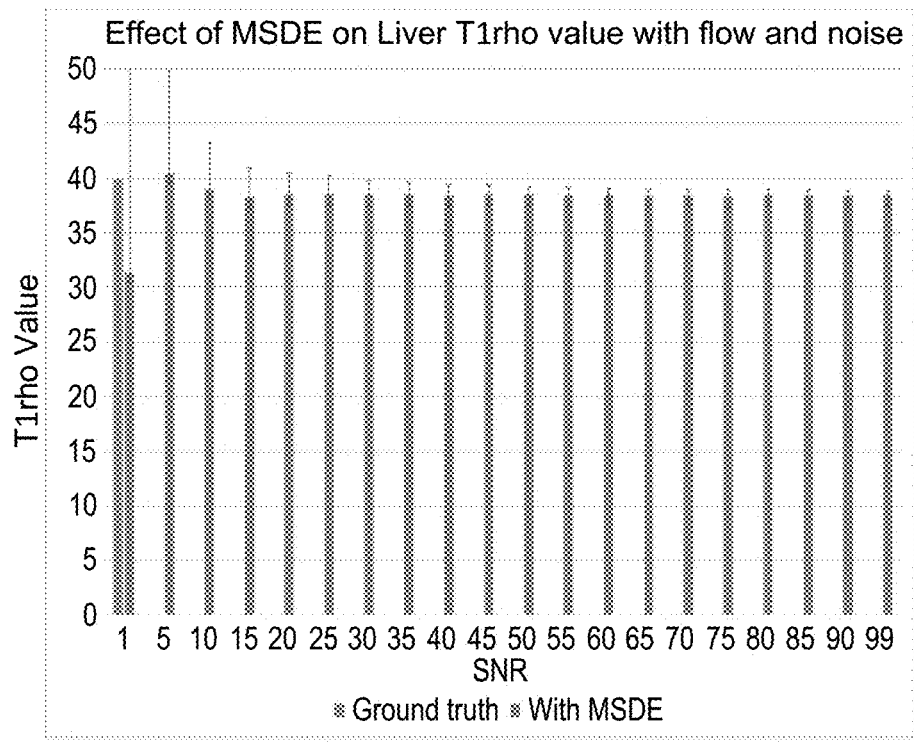
FIG. 11 shows a bar chart indicating the effect of signal-to-noise ratio (SNR) on measurements of T1rho, from a simulation of a pulse sequence according to an embodiment of the present invention.

FIG. 11 shows a bar chart indicating the effect of signal-to-noise ratio (SNR) on measurements of T1rho. For low SNR, measured T1rho (blue bars, shown with error bars) has oscillations with large error. As SNR increases (e.g., SNR>30), T1rho converges to approximately the ground truth value (indicated by the orange bar at the left).

Figure 12:
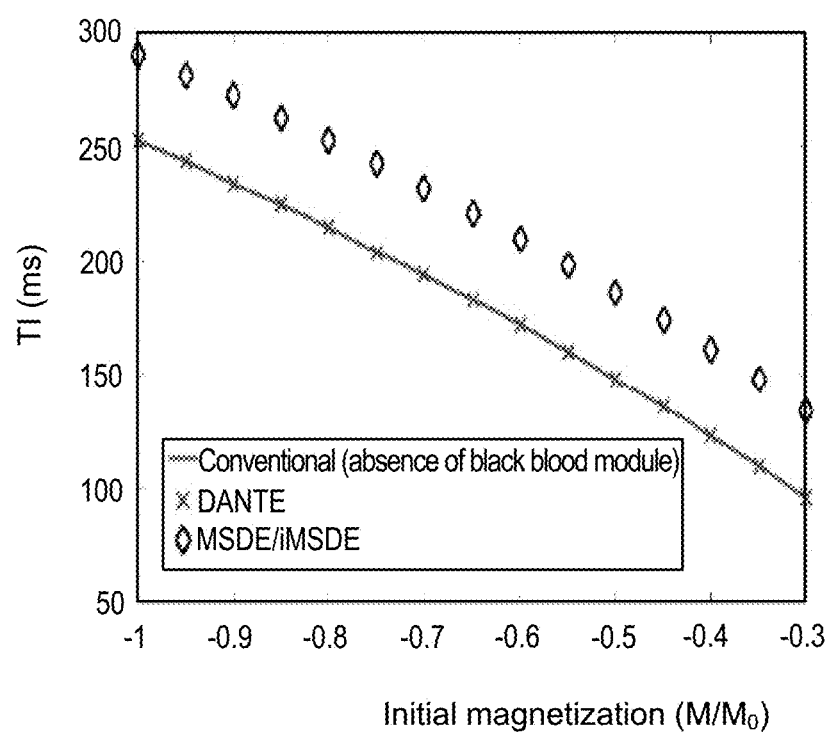
FIG. 12 shows the effect of varying the time interval between fat suppression and T1rho prep, from a simulation of a pulse sequence according to an embodiment of the present invention.

FIG. 12 shows the time interval (TI) as a function of the initial magnetization. The time interval TI is defined as the time between fat suppression (using SPAIR) and magnetization prep. TI is calculated such that the fat signal is zero at the beginning of magnetization prep. In FIG. 12, TI is shown as a function of initial magnetization for a conventional pulse sequence with no blood suppression (line), a pulse sequence using MSDE for blood suppression (diamonds), and a pulse sequence using DANTE for blood suppression (X). Initial magnetization is represented as a ratio relative to equilibrium magnetization $M_0$. As can be seen, compared to a conventional pulse sequence, MSDE changes the TI at a given initial magnetization, while DANTE has no effect. Accordingly, where MSDE is used, the time interval TI can be adjusted accordingly to achieve fat suppression for a particular initial magnetization.

It will be appreciated that these simulation results are illustrative. In some instances, certain simplifying assumptions have been made; for instance, the model does not include effects of eddy currents. However, it is believed that the results indicate the usefulness of MSDE and DANTE for blood suppression during T1rho imaging relaxometry.

As noted above, T1rho is not the only parameter of interest in connection with diagnosis of liver disease. For instance, T2 is also of interest. Some embodiments of the present invention support simultaneous acquisition of data for determining T1rho and T2 maps in a single breath-hold. In addition, the simultaneous acquisition of data for T1rho and T2 maps can simplify the determination of a composite metric such as R1rho-R2, where R1rho=1/T1rho and R2=1/T2. For instance, since the data for both T1rho and T2 is acquired simultaneously, problems of spatial misregistration between the two measurements can be reduced or eliminated.

The pulse sequence can be similar to pulse sequences shown in FIG. 2 or FIG. 8, with SPAIR for fat suppression and DIR, MSDE, or DANTE for blood suppression. The pulse sequence concatenates the acquisition sequence used for T1rho and the acquisition sequence used for T2. The T1rho prep sequence can be as described above. The T2 prep sequence can include, for instance, a train of non-selective composite refocusing RF pulses 90x-180y-90x with the MLEV phase scheme. Following the magnetization prep sequence, the same SSFSE acquisition can be used to acquire data for both T1rho and T2 maps. In some embodiments, gradient reversal technology can be applied during the SSFSE echo train to further improve fat suppression. For the first TSL and the first TE, the T1rho-weighted image is the same as the T2-weighted image.

Simulations show that the diagnostic value of T1rho and T2 measurements benefit from blood suppression. For example, FIGS. 13A and 13B show receiver operating characteristic (ROC) curves generated using Monte Carlo simulations with different levels of blood suppression (as indicated in the legend). For each curve, 10,000 trials were used. In FIG. 13A, the difference in T1rho between diseased and normal liver parenchyma is assumed to be 5 ms; in FIG. 13A, the difference is assumed to be 10 ms. As indicated by the increased sensitivity at a given specificity, blood suppression can significantly improve detectability of liver disease. While these results are shown for T1rho measurement, T2 measurement may also benefit from blood suppression.

In vivo testing of simultaneous acquisition of T1rho and T2 data has been performed on a set of volunteer subjects. Tests were conducted using a Philips Achieva TX 3.0 T scanner equipped with a dual transmitter. A 32-channel cardiac coil was used as the receiver RF coil. RF shimming was applied to reduce B1 inhomogeneity. The subjects were scanned in a supine position. Two-dimensional axial images of the subjects' livers were acquired with phase encoding along anterior-posterior direction. Images were acquired with TSL for T1rho of 0, 10, 30, and 50 ms; TE for T2 prep of 0, 6.9, 20.5, and 44.5 ms. The spin lock frequency was 500 Hz. Parameters for MRI imaging included: TR=2000 ms; TE=15 ms; in-plane resolution=1.5 mm×1.5 mm; Single-slice T1rho and T2 data sets were acquired within a single breath-hold time of 14 seconds.

Figure 14:
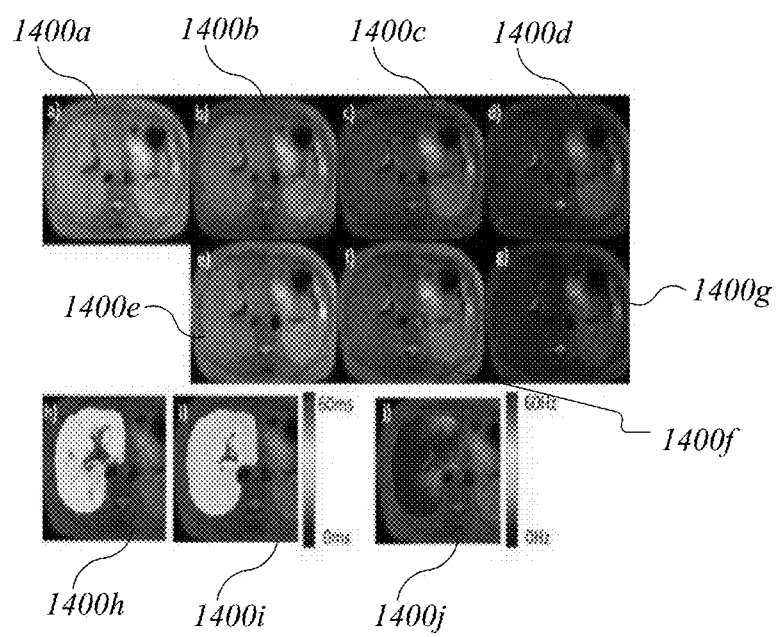
FIG. 14 shows an example of images and parametric maps resulting from a simultaneous acquisition of T1rho and T2 maps using a pulse sequence according to an embodiment of the present invention.

FIG. 14 shows an example of images and parametric maps resulting from a simultaneous acquisition of T1rho and T2 maps using a pulse sequence according to an embodiment of the present invention. Shown at 1400*a* is a T1rho-weighted image with TSL=0, which is the same as a T2-weighted image with TE=0. Shown at 1400*b-d* are T1rho-weighted images with TSL=10, 30, and 50 ms, respectively. Shown at 1400*e-g* are T2-weighted images with TE of 6.9, 20.5, and 44.5 ms, respectively. Shown at 1400*h* is a T1rho map determined from images 1400*a-d*. Shown at 1400*i* is the T2 map determined from images 1400 a and 1400*e-g*. Shown at 1400*j* is a composite metric R1rho-R2 as computed from T1rho map 1400*h* and T2 map 1400*i*.

Techniques and pulse sequences as described herein may have various clinical applications. T1rho (and T2) measurement is appealing in a clinical setting, in part because it does not require contrast agents, extra hardware, or complex workflows, and because it involves no ionized radiation. The spin-locking RF pulses used in T1rho imaging create sensitivity to low-frequency motional processes of macromolecules in biological systems. For example, liver fibrosis involves the accumulation of collagen, proteoglycans, and other macromolecules in the extracellular matrix. Changes in the macromolecular environment of diseased liver tissue can be measured by measuring T1rho. Indeed, elevated T1rho values have been detected in patients with liver cirrhosis and other liver fibrosis. By improving the measurements of T1rho using blood suppression techniques (e.g., as described above), the diagnostic usefulness of T1rho can be improved. Further, because the physical mechanism of T1rho is different from other imaging methods and parameters (e.g., T2), T1rho may provide complementary diagnostic information.

The effectiveness of T1rho measurement has been tested in a pilot study of subjects divided into two groups: four subjects with liver fibrosis stage F0, six subjects with liver fibrosis stage F1-2. The stages were determined from liver biopsies. For the T1rho study, three slices were acquired using a pulse sequence as described above with reference to FIG. 2.

Figure 15:
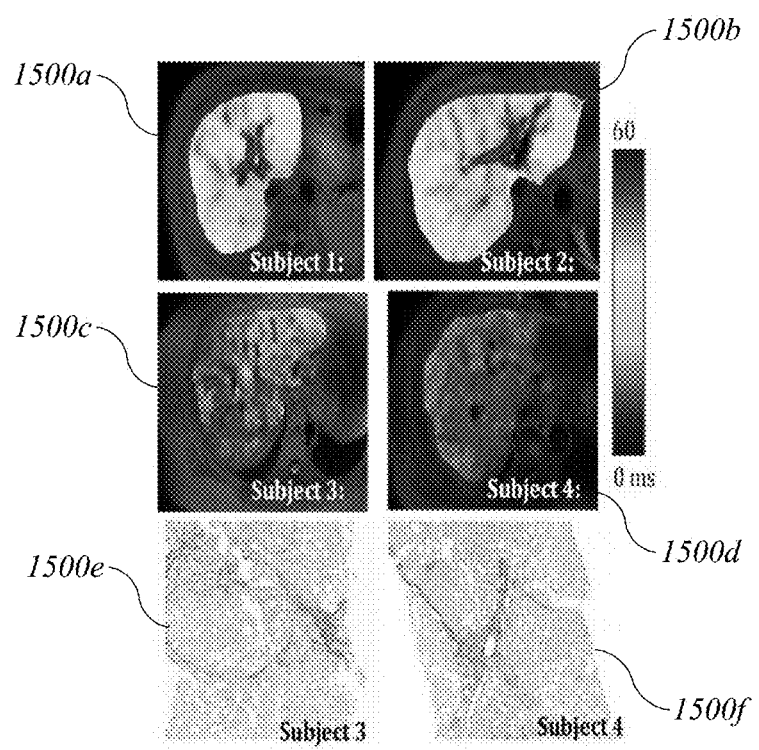
FIG. 15 shows examples of T1rho maps obtained for four experimental subjects using a pulse sequence according to an embodiment of the present invention and histology results of two subjects confirming they have liver fibrosis.

FIG. 15 shows examples of T1rho maps obtained for four of the subjects using a pulse sequence according to an embodiment of the present invention. T1rho maps for two subjects with fibrosis stage F0 are shown at 1500*a* and 1500*b*. T1rho maps for two subjects with fibrosis stage F2 are shown at 1500*c* and 1500*d*. The elevated T1rho values in the F2-stage subjects are apparent. For comparison, histology samples for the F2-stage subjects are shown at 1500*e* and 1500*f*.

Figure 16:
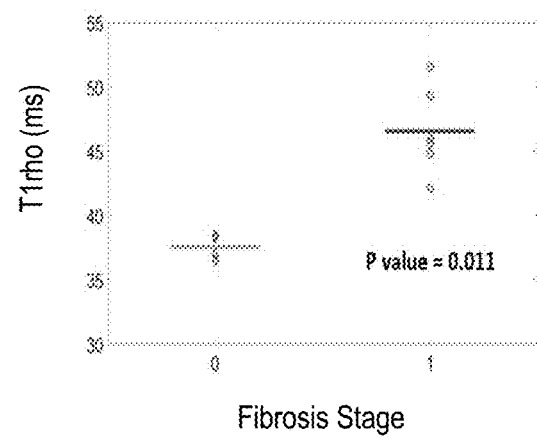
FIG. 16 shows examples of T1rho values measured using a pulse sequence according to an embodiment of the present invention for a set of test subjects, grouped by fibrosis stage.

FIG. 16 shows a plot of T1rho values measured for all of the test subjects, grouped by fibrosis stage. As shown, the mean T1rho value for the four subjects with fibrosis stage F0 was 37.57±0.97 ms, while the mean T1rho value for the six subjects with fibrosis stage F1-2 was 46.58±3.37 ms. Thus, the stage F1-2 subjects show significantly (p=0.011) elevated T1rho values compared to the stage F0 subjects. This illustrates the usefulness of T1rho as a diagnostic tool for liver fibrosis.

As shown above, where simultaneous acquisition of T1rho and T2 is performed, it becomes possible to quantify a composite metric such as R1rho-R2, which the inventors expect to have diagnostic value in connection with liver disease. For instance, prior research has established that R1rho-R2 is sensitive to early detection of osteoarthritis (OA), which is characterized by depletion of proteoglycan and collagen. (See, e.g., Russell et al, "Composite metric R2-R1ρ (1/T2-1/T1ρ as a potential MR imaging biomarker associated with changes in pain after ACL reconstruction: A six-month follow-up," *J. Orthopaedic Res.,* 35(3):718-729 (2017).) Since liver fibrosis is also associated with changes in proteoglycan and collagen, the inventors expect R1rho-R2 to have diagnostic value in detection of liver fibrosis.

While the invention has been described with reference to specific embodiments, those skilled in the art will appreciate that numerous modifications are possible. For example, any of the pulse sequence parameters described above can be modified, and different relaxation parameters can be measured. Further, any type of tissue can be imaged using similar sequences, not limited to the liver.

Thus, although the invention has been described with respect to specific embodiments, it will be appreciated that the invention is intended to cover all modifications and equivalents within the scope of the following claims.

What is claimed is:

1. A method of generating an image using a magnetic resonance imaging (MRI) apparatus, the method comprising:
    applying a magnetization reset pulse sequence;
    applying a magnetization preparation pulse sequence for quantification of a relaxation parameter, wherein a time between applying the magnetization reset pulse sequence and applying the magnetization preparation pulse sequence corresponds to a T1 recovery period;
    applying an acquisition pulse sequence including a fast spin echo (FSE) pulse sequence, the FSE pulse sequence including an excitation pulse and a plurality of refocusing pulses, wherein a delay time between applying the magnetization preparation pulse sequence and applying the acquisition pulse sequence is 2 ms or less;
    acquiring data during the acquisition pulse sequence;
    generating image data based on the acquired data, wherein in the image data, a blood signal is at least partially suppressed; and
    quantifying, based on the image data, the relaxation parameter at each of a plurality of locations within a region of a subject of interest.

2. The method of claim 1 wherein the relaxation parameter is T1rho or T2.

3. The method of claim 1 wherein the magnetization preparation pulse sequence includes a T1rho preparation sequence.

4. The method of claim 1 wherein the magnetization preparation pulse sequence includes a T2 preparation sequence.

5. The method of claim 1 wherein the magnetization preparation pulse sequence includes a T1rho preparation sequence and a T2 preparation sequence, and wherein the data acquired during the acquisition pulse sequence is used to quantify both T1rho and T2.

6. The method of claim 5 further comprising:
    computing, based on the quantification of T1rho and T2, a composite parameter R1rho–R2, wherein R1rho=1/T1rho and R2=1/T2.

7. The method of claim 1 further comprising:
    during the T1 recovery period, applying a blood suppression pulse sequence.

8. The method of claim 7 wherein the blood suppression pulse sequence is a double inversion recovery (DIR) sequence.

9. The method of claim 7 wherein the blood suppression pulse sequence is a motion-sensitized driven equilibrium (MSDE) sequence applied near the end of the T1 recovery period.

10. The method of claim 7 wherein the blood suppression pulse sequence is a delay alternating with nutation for tailored excitation (DANTE) sequence.

11. The method of claim 1 further comprising:
during the T1 recovery period, applying a fat suppression pulse sequence.

12. The method of claim 11 wherein the fat suppression pulse sequence is a spectral attenuated inversion recovery (SPAIR) sequence.

13. The method of claim 1 further comprising:
during the T1 recovery period, applying a spectral attenuated inversion recovery (SPAIR) sequence for fat suppression; and
after applying the SPAIR sequence, applying a blood suppression sequence.

14. The method of claim 13 wherein the blood suppression sequence is a motion-sensitized driven equilibrium (MSDE) sequence.

15. The method of claim 1 further comprising, during the T1 recovery period:
applying a double inversion recovery (DIR) sequence for blood suppression; and
after applying the DIR sequence, applying a spectral attenuated inversion recovery (SPAIR) sequence for fat suppression.

16. The method of claim 1 further comprising:
selecting a flip angle and an echo time for each of the plurality of refocusing pulses of the FSE pulse sequence.

17. The method of claim 16 wherein the flip angle is selected to be a constant flip angle within a range from 75° to 180°.

18. The method of claim 16 wherein the flip angle is selected to be a variable flip angle that varies within a range from about 70° to about 130°.

19. The method of claim 16 wherein the selected echo time is within a range from about 15 ms to about 35 ms.

20. The method of claim 1 further comprising:
selecting a flip angle for the excitation pulse of the FSE pulse sequence.

21. The method of claim 20 wherein the flip angle is selected to be a 90° angle.

22. The method of claim 20 wherein the flip angle is selected to be a 60° angle.

23. The method of claim 1 wherein the FSE pulse sequence is a single-shot FSE pulse sequence.

24. The method of claim 1 wherein the magnetization preparation pulse sequence includes a T1rho preparation pulse sequence, the method further comprising:
selecting a spin-lock time (TSL) for the T1rho preparation pulse sequence.

25. The method of claim 24 wherein the selected spin-lock time is within a range from 0 to 60 ms.

26. The method of claim 1 wherein the subject of interest comprises a tissue of a patient.

27. The method of claim 26 wherein the tissue comprises liver tissue.

28. The method of claim 1 wherein the MRI apparatus provides a field strength of at least 1.5 T.

29. The method of claim 1 wherein the MRI apparatus provides a field strength of at least 3.0 T.

30. The method of claim 1 wherein quantifying the relaxation parameter includes applying a mono-exponential relaxation model to the image data.

31. The method of claim 1 wherein the acquisition pulse sequence includes a phase compensation sequence prior to the FSE pulse sequence.

32. An MRI system comprising:
an MRI apparatus having a magnet, a gradient coil, and one or more radiofrequency (RF) coils; and
a computer communicably coupled to the Mill apparatus, the computer having a processor, a memory, and a user interface, the processor being configured to:
control the Mill apparatus to apply a magnetization reset pulse sequence;
control the MRI apparatus to apply a magnetization preparation pulse sequence for quantification of a relaxation parameter, wherein a time between applying the magnetization reset pulse sequence and applying the magnetization preparation pulse sequence corresponds to a T1 recovery period;
control the MRI apparatus to apply an acquisition pulse sequence including a fast spin echo (FSE) pulse sequence, the FSE pulse sequence including an excitation pulse and a plurality of refocusing pulses, wherein a delay time between applying the magnetization preparation pulse sequence and applying the acquisition pulse sequence is 2 ms or less;
acquire data from the MRI apparatus during the acquisition pulse sequence;
generate image data based on the acquired data, wherein in the image data, a blood signal is at least partially suppressed; and
quantify, based on the image data, the relaxation parameter at each of a plurality of locations within a region of a subject of interest.

33. The MRI system of claim 32 wherein the relaxation parameter is T1rho or T2.

34. The MRI system of claim 32 wherein the magnetization preparation pulse sequence includes a T1rho preparation sequence.

35. The MRI system of claim 32 wherein the magnetization preparation pulse sequence includes a T2 preparation sequence.

36. The Mill system of claim 32 wherein the magnetization preparation pulse sequence includes a T1rho preparation sequence and a T2 preparation sequence, and wherein the processor is further configured such that the data acquired during the acquisition pulse sequence is used to quantify both T1rho and T2.

37. The MRI system of claim 36 wherein the processor is further configured to:
compute, based on the quantification of T1rho and T2, a composite parameter R1rho−R2, wherein R1rho=1/T1rho and R2=1/T2.

38. The MRI system of claim 32 wherein the processor is further configured to:
apply a blood suppression pulse sequence during the T1 recovery period.

39. The MRI system of claim 38 wherein the blood suppression pulse sequence is a double inversion recovery (DIR) sequence.

40. The MRI system of claim 38 wherein the blood suppression pulse sequence is a motion-sensitized driven equilibrium (MSDE) sequence applied near the end of the T1 recovery period.

41. The MRI system of claim 38 wherein the blood suppression pulse sequence is a delay alternating with nutation for tailored excitation (DANTE) sequence.

42. The MRI system of claim 32 wherein the processor is further configured to:
apply a fat suppression pulse sequence during the T1 recovery period.

43. The MRI system of claim 42 wherein the fat suppression pulse sequence is a spectral attenuated inversion recovery (SPAIR) sequence.

44. The MRI system of claim 32 wherein the processor is further configured to, during the T1 recovery period:
apply a spectral attenuated inversion recovery (SPAIR) sequence for fat suppression; and
apply a blood suppression sequence after applying the SPAIR sequence.

45. The MRI system of claim 44 wherein the blood suppression sequence is a motion-sensitized driven equilibrium (MSDE) sequence.

46. The MRI system of claim 32 wherein the processor is further configured to, during the T1 recovery period:
apply a double inversion recovery (DIR) sequence for blood suppression; and
apply a spectral attenuated inversion recovery (SPAIR) sequence for fat suppression after applying the DIR sequence.

47. The MRI system of claim 32 wherein a flip angle of each of the plurality of refocusing pulses of the FSE pulse sequence is equal to a constant flip angle.

48. The MRI system of claim 47 wherein the constant flip angle is within a range from 75° to 180°.

49. The MRI system of claim 32 wherein flip angles of different ones of the plurality of refocusing pulses of the FSE pulse sequence are different and each of the flip angles is within a range from about 70° to about 130°.

50. The MRI system of claim 32 wherein an echo time for the FSE pulse sequence is within a range from about 15 ms to about 35 ms.

51. The MRI system of claim 32 wherein the excitation pulse of the FSE pulse sequence has a 90° flip angle.

52. The MRI system of claim 32 wherein the excitation pulse of the FSE pulse sequence has a 60° flip angle.

53. The MRI system of claim 32 wherein the magnetization preparation pulse sequence includes a T1rho preparation pulse sequence that has a spin-lock time within a range from 0 to 60 ms.

* * * * *